(12) United States Patent
Subramanian et al.

(10) Patent No.: US 9,391,641 B2
(45) Date of Patent: Jul. 12, 2016

(54) SYNDROME TABLES FOR DECODING TURBO-PRODUCT CODES

(71) Applicant: SK Hynix Inc., Gyeonggi-do (KR)

(72) Inventors: Arunkumar Subramanian, San Jose, CA (US); Naveen Kumar, San Jose, CA (US); Zheng Wu, San Jose, CA (US); Lingqi Zeng, San Jose, CA (US); Jason Bellorado, San Jose, CA (US)

(73) Assignee: SK Hynix Inc., Gyeonggi-do (KR)

( * ) Notice: Subject to any disclaimer, the term of this patent is extended or adjusted under 35 U.S.C. 154(b) by 70 days.

(21) Appl. No.: 14/219,764

(22) Filed: Mar. 19, 2014

(65) Prior Publication Data

US 2014/0325320 A1    Oct. 30, 2014

Related U.S. Application Data

(60) Provisional application No. 61/816,512, filed on Apr. 26, 2013.

(51) Int. Cl.
*H03M 13/00* (2006.01)
*H03M 13/15* (2006.01)
*H03M 13/29* (2006.01)

(52) U.S. Cl.
CPC .......... *H03M 13/159* (2013.01); *H03M 13/152* (2013.01); *H03M 13/153* (2013.01); *H03M 13/1545* (2013.01); *H03M 13/2963* (2013.01); *H03M 13/6505* (2013.01); *H03M 13/1515* (2013.01)

(58) Field of Classification Search
CPC .......... H03M 13/159; H03M 13/6505; H03M 13/152; H03M 13/1545; H03M 13/153; H03M 13/2963; H03M 13/1515
See application file for complete search history.

(56) References Cited

U.S. PATENT DOCUMENTS

| | | |
|---|---|---|
| 2004/0019842 A1 | 1/2004 | Argon et al. |
| 2006/0179400 A1* | 8/2006 | Qian et al. ............ 714/784 |
| 2006/0212781 A1 | 9/2006 | Hewitt et al. |
| 2009/0086839 A1 | 4/2009 | Xu et al. |
| 2010/0235718 A1 | 9/2010 | Yang et al. |

FOREIGN PATENT DOCUMENTS

| | | |
|---|---|---|
| WO | 03030370 | 4/2003 |

OTHER PUBLICATIONS

Lee et al. "A 2.74-pJ/bit, 17.7-Gb/s Iterative Concatenated-BCH Decoder in 65-nm CMOS for NAND Flash Memory", IEEE Journal of Solid-State Circuits, vol. 48, No. 10, Oct. 2013.

* cited by examiner

*Primary Examiner* — Cynthia Britt
*Assistant Examiner* — Thien D Nguyen
(74) *Attorney, Agent, or Firm* — IP & T Group LLP

(57) ABSTRACT

A set of one or more component syndromes associated with a turbo product code (TPC) codeword is obtained from a component syndrome buffer. Component decoding is performed on the set of one or more component syndromes.

20 Claims, 14 Drawing Sheets

400

Row Syndrome Buffer

| Row Codeword Index | $S_0$ | $S_1$ | ... | $S_{2t_r-1}$ | Modified? | Error Free? |
|---|---|---|---|---|---|---|
| 1 | (m bits) | (m bits) | ... | (m bits) | (1 bit) | (1 bit) |
| 2 | (m bits) | (m bits) | ... | (m bits) | (1 bit) | (1 bit) |
| ⋮ | ⋮ | ⋮ | ... | ⋮ | ⋮ | ⋮ |
| $N_r$ | (m bits) | (m bits) | ... | (m bits) | (1 bit) | (1 bit) |

402

Column Syndrome Buffer

| Column Codeword Index | $S_0$ | $S_1$ | ... | $S_{2t_c-1}$ | Modified? | Error Free? |
|---|---|---|---|---|---|---|
| 1 | (m bits) | (m bits) | ... | (m bits) | (1 bit) | (1 bit) |
| 2 | (m bits) | (m bits) | ... | (m bits) | (1 bit) | (1 bit) |
| ⋮ | ⋮ | ⋮ | ... | ⋮ | ⋮ | ⋮ |
| $N_c$ | (m bits) | (m bits) | ... | (m bits) | (1 bit) | (1 bit) |

← 400

Row Syndrome Buffer

| Row Codeword Index | $S_0$ | $S_1$ | ... | $S_{2t_r-1}$ | Modified? | Error Free? |
|---|---|---|---|---|---|---|
| 1 | (m bits) | (m bits) | ... | (m bits) | (1 bit) | (1 bit) |
| 2 | (m bits) | (m bits) | ... | (m bits) | (1 bit) | (1 bit) |
| ⋮ | ⋮ | ⋮ | ... | ⋮ | ⋮ | ⋮ |
| $N_r$ | (m bits) | (m bits) | ... | (m bits) | (1 bit) | (1 bit) |

← 402

Column Syndrome Buffer

| Column Codeword Index | $S_0$ | $S_1$ | ... | $S_{2t_c-1}$ | Modified? | Error Free? |
|---|---|---|---|---|---|---|
| 1 | (m bits) | (m bits) | ... | (m bits) | (1 bit) | (1 bit) |
| 2 | (m bits) | (m bits) | ... | (m bits) | (1 bit) | (1 bit) |
| ⋮ | ⋮ | ⋮ | ... | ⋮ | ⋮ | ⋮ |
| $N_c$ | (m bits) | (m bits) | ... | (m bits) | (1 bit) | (1 bit) |

FIG. 4

Row Syndrome Buffer 700

| Row Codeword Index | $S_0$ | $S_2$ | Modified? | EF? |
|---|---|---|---|---|
| 1 | All 0s | All 0s | 1 (Yes) | 1 (Yes) |
| 2 | | | 1 (Yes) | 0 (No) |
| 3 | All 0s | All 0s | 1 (Yes) | 1 (Yes) |
| 4 | All 0s | All 0s | 1 (Yes) | 1 (Yes) |
| 5 | | | 1 (Yes) | 0 (No) |
| 6 | All 0s | All 0s | 1 (Yes) | 1 (Yes) |
| 7 | | | 1 (Yes) | 0 (No) |

701
702
703
704
705
706
707

Column Syndrome Buffer 710

| Column Codeword Index | $S_0$ | $S_2$ | Modified? | EF? |
|---|---|---|---|---|
| 1 | All 0s | All 0s | 1 (Yes) | 1 (Yes) |
| 2 | All 0s | All 0s | 1 (Yes) | 1 (Yes) |
| 3 | | | 1 (Yes) | 0 (No) |
| 4 | All 0s | All 0s | 1 (Yes) | 1 (Yes) |
| 5 | All 0s | All 0s | 1 (Yes) | 1 (Yes) |
| 6 | All 0s | All 0s | 1 (Yes) | 1 (Yes) |
| 7 | | | 1 (Yes) | 0 (No) |
| 8 | | | 1 (Yes) | 0 (No) |
| 9 | All 0s | All 0s | 1 (Yes) | 1 (Yes) |
| 10 | | | 1 (Yes) | 0 (No) |
| 11 | All 0s | All 0s | 1 (Yes) | 1 (Yes) |
| 12 | | | 1 (Yes) | 0 (No) |
| 13 | | | 1 (Yes) | 0 (No) |
| 14 | | | 1 (Yes) | 0 (No) |
| 15 | | | 1 (Yes) | 0 (No) |

Row Syndrome Buffer ← 1100

| Row Codeword Index | Modified? | Error Free? |
|---|---|---|
| 1 | 0* (No) | 1 (Yes) |
| 2 | 0* (No) | 1* (Yes) |
| 3 | 0* (No) | 1 (Yes) |
| 4 | 0* (No) | 1 (Yes) |
| 5 | 0* (No) | 0 (No) |
| 6 | 0* (No) | 1 (Yes) |
| 7 | 0* (No) | 1* (Yes) |

1102
1106
1104

Column Syndrome Buffer ← 1110

| Column Codeword Index | Modified? | Error Free? |
|---|---|---|
| 1 | 1 (Yes) | 1 (Yes) |
| 2 | 1 (Yes) | 1 (Yes) |
| 3 | 1 (Yes) | 0 (No) |
| 4 | 1 (Yes) | 1 (Yes) |
| 5 | 1 (Yes) | 1 (Yes) |
| 6 | 1 (Yes) | 1 (Yes) |
| 7 | 1 (Yes) | 0 (No) |
| 8 | 1 (Yes) | 0 (No) |
| 9 | 1 (Yes) | 1 (Yes) |
| 10 | 1 (Yes) | 0 (No) |
| 11 | 1 (Yes) | 1 (Yes) |
| 12 | 1 (Yes) | 0 (No) |
| 13 | 1 (Yes)* | 1* (Yes) |
| 14 | 1 (Yes)* | 1* (Yes) |
| 15 | 1 (Yes) | 0 (No) |

1111
1112
1113
1114
1115
1116
1117
1118
1119
1120
1121
1122
1123
1124
1125

FIG. 11      * = Updated

Row Syndrome Buffer ← 1200

| Row Codeword Index | Modified? | Error Free? |
|---|---|---|
| 1 | 0 (No) | 1 (Yes) |
| 2 | 0 (No) | 1 (Yes) |
| 3 | 0 (No) | 1 (Yes) |
| 4 | 0 (No) | 1 (Yes) |
| 5 | 1* (Yes) | 1* (Yes) | ← 1202
| 6 | 0 (No) | 1 (Yes) |
| 7 | 0 (No) | 1 (Yes) |

Column Syndrome Buffer ← 1210

| Column Codeword Index | Modified? | Error Free? |
|---|---|---|
| 1 | 0* (No) | 1 (Yes) |
| 2 | 0* (No) | 1 (Yes) |
| 3 | 0* (No) | 1* (Yes) | ← 1211
| 4 | 0* (No) | 1 (Yes) |
| 5 | 0* (No) | 1 (Yes) |
| 6 | 0* (No) | 1 (Yes) |
| 7 | 0* (No) | 1* (Yes) | ← 1212
| 8 | 0* (No) | 1* (Yes) | ← 1213
| 9 | 0* (No) | 1 (Yes) |
| 10 | 0* (No) | 1* (Yes) | ← 1214
| 11 | 0* (No) | 1 (Yes) |
| 12 | 0* (No) | 1* (Yes) | ← 1215
| 13 | 0* (No) | 1 (Yes) |
| 14 | 0* (No) | 1 (Yes) |
| 15 | 0* (No) | 1* (Yes) | ← 1216

FIG. 12      * = Updated

SYNDROME TABLES FOR DECODING TURBO-PRODUCT CODES

CROSS REFERENCE TO OTHER APPLICATIONS

This application claims priority to U.S. Provisional Patent Application No. 61/816,512 entitled SYNDROME TABLES FOR DECODING TURBO-PRODUCT CODES BASED ON BOSE-CHAUDHURI-HOCQUENGHEM (BCH) AND REED-SOLOMON (RS) CODES filed Apr. 26, 2013 which is incorporated herein by reference for all purposes.

BACKGROUND OF THE INVENTION

Turbo-product codes (TPC) are a type of error correction codes. During TPC encoding, payload information is arranged in a matrix, and a TPC encoder encodes the rows and columns using component codes. For example, the rows are grouped in some manner (e.g., each group is 1-bit "high") and encoded. Then, the columns are grouped in some manner (e.g., each group is 1-bit "wide") and encoded. On the decoder side, the data is accessed multiple times from a data memory buffer for row decoding and column decoding. The overhead for accessing this huge amount of data from the data memory buffer is significant. An efficient architecture which can overcome this bottleneck would be desirable.

BRIEF DESCRIPTION OF THE DRAWINGS

Various embodiments of the invention are disclosed in the following detailed description and the accompanying drawings.

FIG. 4 is a diagram illustrating embodiments of a row syndrome buffer and a column syndrome buffer.

FIG. 7 is a diagram illustrating an embodiment of a row syndrome buffer and a column syndrome buffer after initialization.

FIG. 11 is a diagram illustrating an embodiment of a row syndrome buffer and a column syndrome buffer after a first iteration of row decoding but before a first iteration of column decoding.

FIG. 12 is a diagram illustrating an embodiment of a row syndrome buffer and a column syndrome buffer after a first iteration of column decoding but before a second iteration of row decoding.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
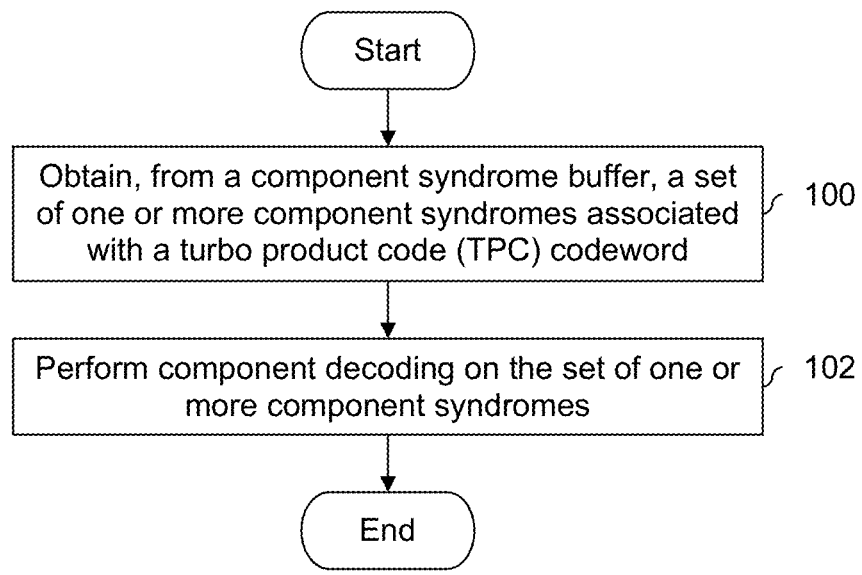
FIG. 1 is a flowchart illustrating an embodiment of a process which uses a stored component syndrome during TPC decoding.

FIG. 1 is a flowchart illustrating an embodiment of a process which uses a stored component syndrome during TPC decoding. In the example shown, the process is performed by a TPC decoder, for example, which is part of a read controller. The TPC decoding process described in FIG. 1 is not tied to any particular TPC format, code rate, and/or component code types and may be used with a variety of TPC encoders, as long as the component codes have a decoder that takes syndromes as input.

At 100, a set of one or more component syndromes associated with a turbo product code (TPC) codeword is obtained from a component syndrome buffer. For example, a TPC codeword includes a plurality of column codewords and a plurality of row codewords. Column codewords and row codewords may be referred to more generally as component codewords. For each codeword, a single syndrome is computed: from a row codeword, a row syndrome is generated and from a column codeword a column syndrome is generated. A component syndrome which is obtained from storage at step 100 may be either a row syndrome or a column syndrome.

In some embodiments, row syndromes and column syndromes are stored separately in a row syndrome buffer and a column syndrome buffer, respectively. In such embodiments, row syndromes would be obtained from the row syndrome buffer and column syndromes would be obtained from the column syndrome buffer.

In some embodiments, during some initialization sequence or other process prior to FIG. 1, a row syndrome buffer and a column syndrome buffer are populated with an initial set of row syndromes and an initial set of column syndromes. For example, a component code used to generate a TPC codeword may be a cyclic error-correction code, such as a Bose-Chaudhuri-Hocquenghem (BCH) code or a Reed-Solomon (RS) code. Given the natural numbers m and t, a t-error correcting binary BCH code of length n=2$^m$−1 is defined as:

$$\{c(x) \in GF(2)[x]: \deg c(x) \leq n-1, c(\alpha)=c(\alpha^2)=c(\alpha^3)=\ldots=c(\alpha^{2t})=0\}$$

where $\alpha \in GF(2^m)$ is a primitive element. In other words, it is the set of all binary polynomials of degree at most n−1 such that when these are treated as polynomials over $GF(2^m)$, they must have $\alpha, \alpha^2, \alpha^3, \ldots, \alpha^{2t}$ as their roots.

If c(x) is the transmitted codeword, e(x) is the error polynomial, and r(x)=c(x)+e(x) is the received codeword, then given that $\alpha, \alpha^2, \ldots, \alpha^{2t}$ are roots of c(x), an initial component syndrome may be calculated as:

$$S_i = r(\alpha^{i+1}) = e(\alpha^{i+1})$$

for i=0, 1, . . . , 2t−1.

Any appropriate syndrome technique may be used to populate a row syndrome buffer and/or a column syndrome buffer with an initial set of row syndromes or an initial set of column syndromes, respectively.

At 102, component decoding is performed on the set of one or more component syndromes. For example, if a set of row syndromes is obtained at step 100, then component decoding at step 102 comprises row decoding and step 102 may be performed by a dedicated row decoder or a general-purpose decoder configured with the row code. Or, if a set of column syndromes is obtained at step 100, then component decoding at step 102 comprises column decoding and step 102 may be performed by a dedicated column decoder or a general-purpose decoder configured with the column code. Whenever a component decoder is successful, step 102 includes (1) committing the corrections to the TPC codeword (for example which were buffered locally in the controller's memory until it was known that the corrections should be made to the TPC codeword), and (2) making appropriate changes to the component syndrome buffers (again, buffered until it was known that the corrections should be made to the component syndrome buffers).

The process of FIG. 1 may be repeated as many times as needed, either during row decoding or column decoding. For example, so long as there are errors remaining in the TPC codeword, the process of FIG. 1 may be repeated.

One benefit to the TPC decoding technique described above is that a bottleneck may be reduced. For example, some other row decoders and column decoders are configured to input codewords (e.g., a row codeword, a column codeword, or a TPC codeword) which creates a read bottleneck at a TPC buffer on a storage controller at the initial stage of the component decoder. By using decoders which are configured to input syndromes (e.g., as opposed to some type of codeword), and storing and updating the syndromes separately from the codewords, the number of read accesses to the TPC buffer is significantly reduced. Moreover, some other row decoders and column decoders are configured to output codewords, which also creates a bottleneck at the final stage of component decoding. By using decoders which are configured to output only the corrections to the component codewords (e.g., as opposed to outputting the entire component codeword), the number of write accesses to the TPC buffer is also significantly reduced.

For example, consider a TPC constructed with constituent binary BCH codes over $GF(2^{12})$, where the length n, dimension k and maximum error-correction capability t are:

$$n_{row}=2108, k_{row}=2048, t_{row}=5$$

$$n_{col}=2132, k_{col}=2048, t_{col}=7$$

The TPC code encodes 8 kB of information bits arranged in a 32×2048 binary matrix. There are 32 row codewords and 33 column codewords in a TPC codeword, with each column codeword spanning 64 columns of information bits.

With respect to reading, using some other techniques, decoding one component codeword requires reading about 256 bytes of memory. Using the TPC technique described herein, decoding one component codeword requires reading at most 7 syndromes, which is less than 11 bytes of syndrome buffer memory.

With respect to writing, using some other techniques, the successful decoding of a component codeword results in writing about 256 bytes of memory to the TPC buffer. In contrast, the TPC decoding technique described herein writes at most 7 bits to the TPC buffer, and at most 7×5×12=420 bits to a syndrome buffer, totaling less than 53 bytes.

Another benefit to the TPC decoding technique described herein is that the syndromes do not need to be regenerated at each decoding iteration. This saves power, processing resources, and time.

Figure 2:
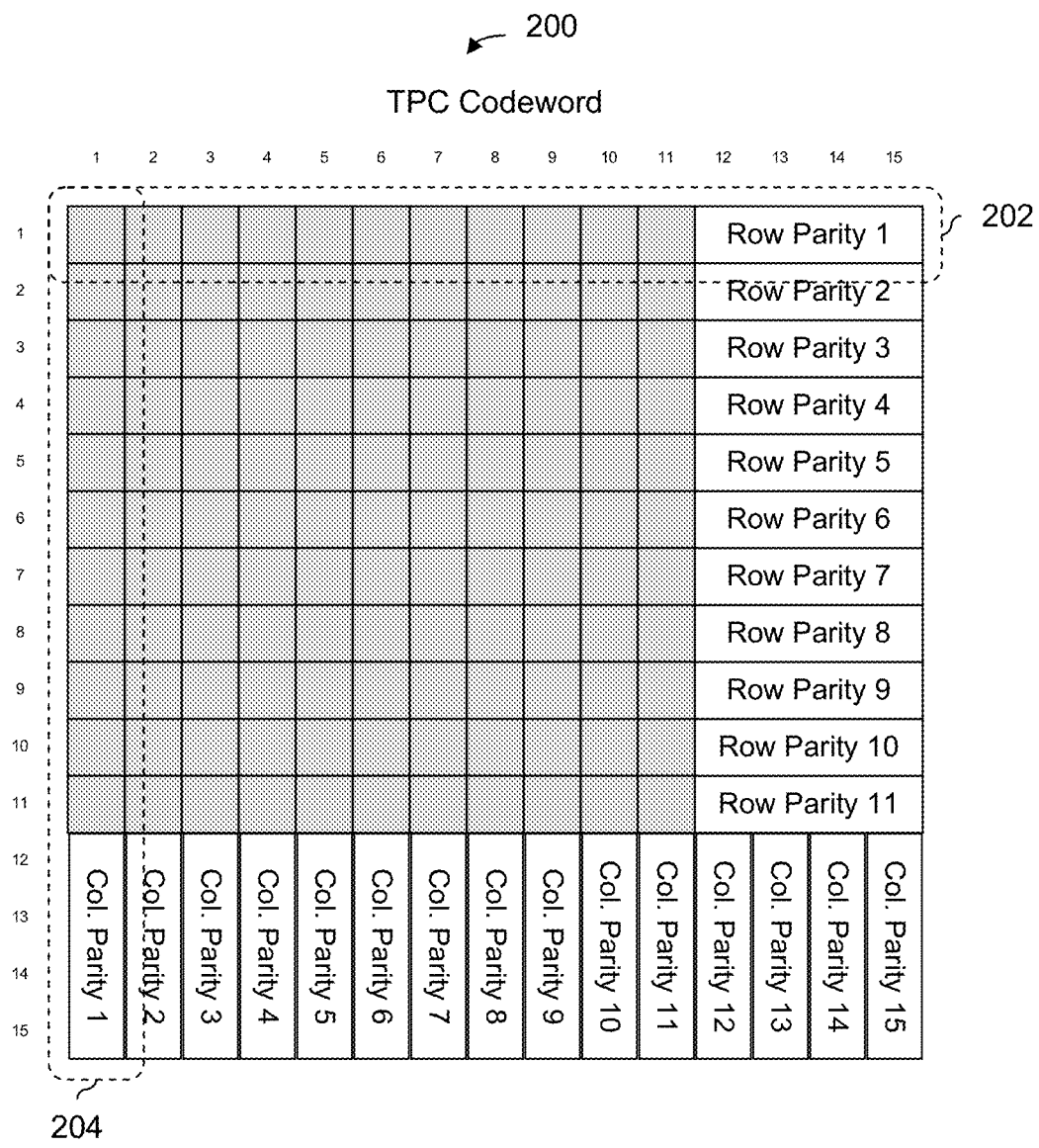
FIG. 2 is a diagram illustrating an embodiment of a TPC codeword, a row codeword, and a column codeword.

FIG. 2 is a diagram illustrating an embodiment of a TPC codeword, a row codeword, and a column codeword. In the example shown, codeword 200 is an example of a TPC codeword. Row codeword 202 and column codeword 204 are examples of component codewords. In the example shown, 121 payload bits (indicated by the shaded boxes) are TPC encoded into 225 bits. To obtain the row and column parity information shown, a TPC encoder (not shown) first encodes the 11 rows of payload information (shown as shaded blocks) to generate the 11 row parities. Then, the TPC encoder encodes the 15 columns of payload information plus row parities to generate the 15 column parities. In this example, each row parity and column parity is 4 bits long.

Note that this TPC is merely exemplary and is not intended to be limiting. For example, the code rate may be something other than 11/15. In some embodiments, multiple bits are grouped together prior to column or row encoding. For example, each row (column) codeword may have a height (width) of multiple bits. In another example, a row (column) codeword includes all bits from one row (column), plus half of the bits from the next row (column). In other words, a row (column) codeword may have a height (width) which is a fractional number of bits.

Figure 3:
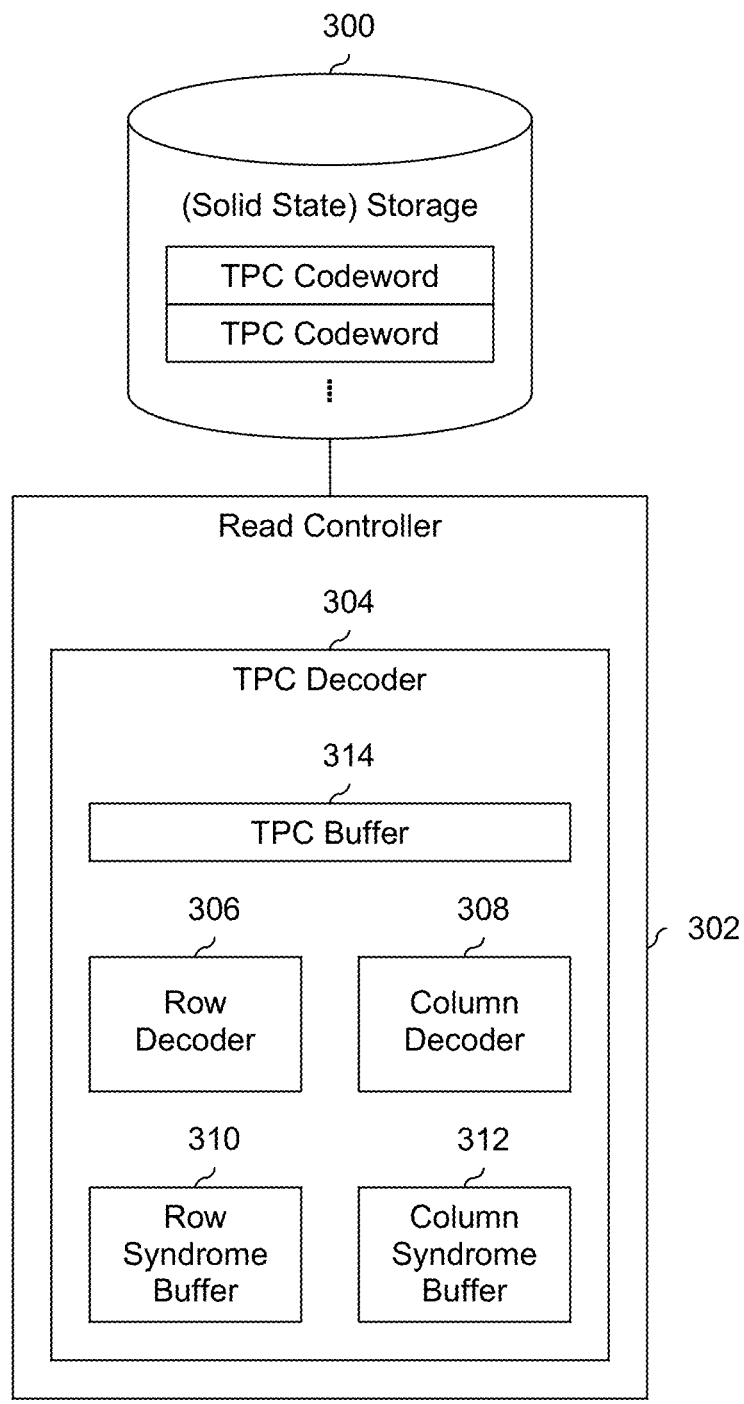
FIG. 3 is a diagram illustrating a first embodiment of a TPC decoder.

FIG. 3 is a diagram illustrating a first embodiment of a TPC decoder. TPC decoder 304 shows one embodiment of a system which performs the process of FIG. 1. For clarity, components which are not directly related to the steps recited in FIG. 1 are not shown herein. For example, a write controller corresponding to read controller 302 and a TPC encoder corresponding to TPC decoder 304 are not shown. In some embodiments, read controller 302 (which includes TPC decoder 304) is implemented on a semiconductor device, such as an application-specific integrated circuit (ASIC) or field-programmable gate array (FPGA). In some such embodiments, storage 300 comprises another semiconductor device.

TPC codewords are stored on storage 300 (e.g., stored there by a write controller, not shown). In some embodiments, storage 300 comprises solid state storage, such as NAND Flash. During some initialization process, TPC codewords are retrieved from storage 300 and row syndrome buffer 310 and column syndrome buffer 312 are populated with an initial set of row syndromes and column syndromes, respectively, which are generated from one or more TPC codewords stored on storage 300. In some embodiments, one or more TPC codewords that are to be corrected are retrieved from storage 300 are stored in a TPC buffer 314 in the read controller, for example by some initialization process (not shown).

Once row syndrome buffer 310 and column syndrome buffer 312 have been populated, processing by row decoder 306 and column decoder 308 begins. In this example, row decoding goes first. Row decoder 306 obtains row syndromes from row syndrome buffer 310. This is one example of step 100 in FIG. 1. Then, row decoder 306 performs row decoding on the row syndromes. This is one example of step 102 in FIG. 1. As part of the decoding process, some of the syndromes in row syndrome buffer 310 and/or column syndrome buffer 312 may be updated by row decoder 306. Moreover, the bits corrected by the decoding process 102 may also be committed to TPC buffer 314 (e.g., if/when it is determined that those bit corrections should be committed to TPC buffer 314).

After row decoder 306 has completed all row decoding, column decoder 308 obtains column syndromes from column syndrome buffer 312. This is one example of step 100 in FIG. 1 and the obtained column syndromes may include some which were updated by row decoder 306. Column decoder 308 then performs column decoding on the obtained column syndromes. This is one example of step 102 in FIG. 1. As with row decoder 306, column decoding by column decoder 308 may include updating some of the syndromes in row syndrome buffer 310 and/or column syndrome buffer 312. The bits corrected by the column decoder may also be committed to TPC buffer 314 (e.g., if/when it is determined that the bit corrections should be committed to TPC buffer 314). Note that although row decoder 306 and column decoder 308 are shown here as two separate pieces of hardware, in some embodiments a row decoder and a column decoder are combined in a single component and/or they share the same hardware.

In some embodiments, row decoder 306 and/or column decoder 308 includes an error locator polynomial generator, an error locator, and (if needed) an error magnitude generator. The error locator polynomial generator uses the syndromes $S_0, S_1, \ldots, S_{2t-1}$ to generate the error location polynomial $\Lambda(x)$, which is defined as:

$$\Lambda(x) = \prod_{i=1}^{v} (1 - \alpha^{j_i} x)$$

In some embodiments, the Berlekamp-Massey Algorithm (BMA) is used to generate the error locator polynomial.

The roots of the error location polynomial (i.e., $j_1, j_2, \ldots, j_v$ in the equation above) indicate the locations of the errors, so finding the roots of the error location polynomial corresponds to finding the locations of the errors in a corresponding codeword. In some embodiments, a Chien Search (CS) is used to find the roots of the error location polynomial. For binary symbols, once the error locations have been identified, correction simply involves flipping the bit at each identified error location. For non-binary symbols, the error magnitude needs to be calculated by an error magnitude generator in order for the correction to be made. In some embodiments, the Forney Algorithm is used to calculate the error magnitude.

Compared to some other TPC decoders, row decoder 306 and column decoder 308 are configured to directly input syndromes. For example, while some other decoders may be configured to input a codeword (e.g., a TPC codeword or a component codeword) and generate one or more syndromes from the codeword, row decoder 306 and column decoder 308 skip that the step.

FIG. 4 is a diagram illustrating embodiments of a row syndrome buffer and a column syndrome buffer. In some embodiments, row syndrome buffer 310 and column syndrome buffer 312 in FIG. 3 are implemented as shown. In the example shown, row syndrome buffer 400 is used to store row syndromes and associated status information and column syndrome buffer 402 is used to store column syndromes and associated status information. Using FIG. 2 as an example, $N_r=11$ and $N_c=15$.

Each record in row syndrome buffer 400 includes $2t_r$ row syndromes, where $t_r$ is the error correction capability of the row code. Similarly, each record in column syndrome buffer 402 includes $2t_c$ column syndromes, where $t_c$ is the error correction capability of the column code. Using FIG. 2 as an example, the row syndromes generated for row codeword 202 would be stored in the $1^{st}$ row codeword index in row syndrome buffer 400 and the column syndromes generated for column codeword 204 would be stored in the $1^{st}$ column codeword index in column syndrome buffer 402. Each column syndrome and row syndrome is m bits long where m relates to the Galois Field on which the exemplary BCH code is constructed. In some embodiments, the row (column) syndrome buffer may only store a subset of the $2t_r$ syndromes ($2t_c$ syndromes) for each record, if the remaining syndromes can be generated from the subset. For example, if the component code is a t error correcting primitive binary BCH code, then only the even syndromes $S_{2i}$ need to be stored since $S_{2i+1} = (S_i)^2$.

In addition to the syndromes, buffers 400 and 402 store status information, including a modified bit. The modified bit is used to track which syndromes were modified by the other component decoder (e.g., the row decoder or the column decoder) during the immediately prior component decoding. Another way of thinking about the modified bit is a bit which flags which information should be checked (e.g., assuming further error correction decoding is desired). This enables the row decoder or column decoder (whichever is currently active) to know which syndromes to process at the current iteration. A more detailed example of how the modified bit is set and interpreted is given below.

In addition to the modified bit, the status information includes an error free bit. The error free bit indicates whether row or column decoding doesn't require any decoding (e.g., indicated by all of the syndromes having all 0s). An error free bit that is set to 1 indicates that that row codeword or column codeword will be declared error-free by the component decoder. If all of the error free bits in row syndrome buffer 400 and column syndrome buffer 402 are 1, then the TPC codeword has been successfully decoded and the TPC decoder stops.

Returning to FIG. 1, the status bits (i.e., the modified bit and error free bit) in row syndrome buffer 400 and column syndrome buffer 402 are used in some embodiments to drive or dictate what syndromes are obtained at step 100 and used at step 102. In some embodiments, only syndromes which have a modified bit set to 1 and an error free bit set to 0 are obtained at step 100 and used in decoding at step 102. Syndromes which have a modified bit set to 0 or an error free bit set to 1 are not obtained in such embodiments.

The following figure shows an example of an initialization process. In some embodiments, the exemplary initialization process is used to initialize a component syndrome buffer, such as a row syndrome buffer or a column syndrome buffer.

Figure 5:
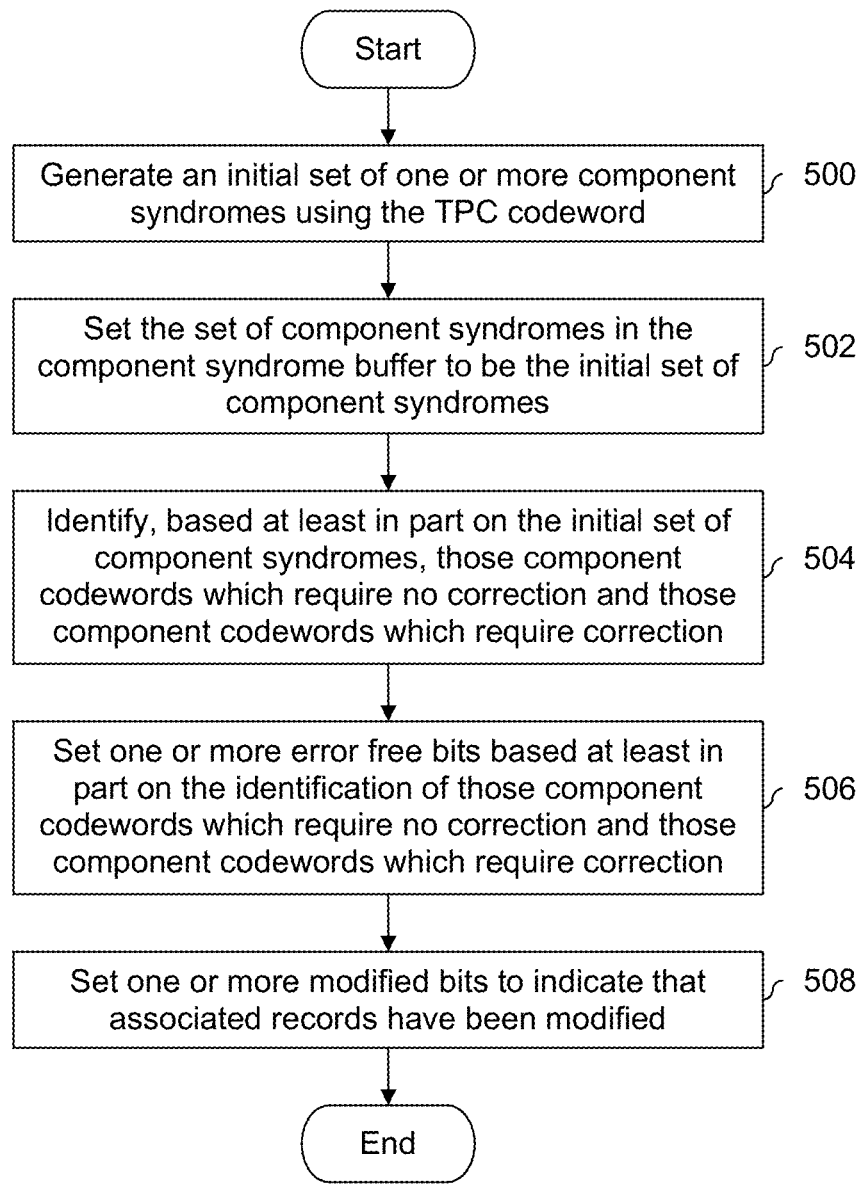
FIG. 5 is a flowchart illustrating an embodiment of an initialization process.

FIG. 5 is a flowchart illustrating an embodiment of an initialization process. In one example of how FIG. 5 is used, FIG. 5 is performed before FIG. 1. In another example, the process of FIG. 5 is used to populate row syndrome buffer 400 and column syndrome buffer 402 in FIG. 4 as shown therein.

At 500, an initial set of one or more component syndromes is generated using the TPC codeword. In various embodiments, the initial set of component syndromes may comprise an initial set of one or more row syndromes and/or an initial set of one or more column syndromes. Any appropriate syndrome generation technique may be used.

At 502, the set of component syndromes in the component syndrome buffer is set to be the initial set of component syndromes. Some examples of a component syndrome buffer include a row syndrome buffer and a column syndrome buffer. For example, the initial values which are generated at step 500 are stored in the syndrome fields in row syndrome buffer 400 and/or column syndrome buffer 402 in FIG. 4.

At 504, those component codewords which require no correction and those component codewords which require correction are identified, based at least in part on the initial set of component syndromes. For example, if all component syndromes for a given component codeword are all 0s, then that component codeword does not require any correction. If not (e.g., there is at least one non-zero value in the relevant component syndromes), then the corresponding component codeword requires correction.

At 506, one or more error free bits are set based at least in part on the identification of those component codewords which require no correction and those component codewords which require correction. For example, component codewords which have been identified as being error-free (i.e., those component codewords which require no correction) have their error free bits set to 1 and those component codewords which have been identified as being in error (i.e., those component codewords which require correction) have their error free bits set to 0.

At 508, one or more modified bits are set to indicate that associated records have been modified. For example, all of the modified bits in the component syndrome buffer are set to 1. This will cause a component decoder to process the syndromes stored in that record, assuming that further component decoding is required.

Although not shown in FIG. 5, in some embodiments an initialization process also initializes a TPC buffer (which is configured to store the TPC codeword with any number of corrections applied) with an initial TPC codeword which is received or read from storage (e.g., stolid state storage).

The following figures show an exemplary row syndrome buffer and exemplary column syndrome buffer being initialized.

Figure 6:
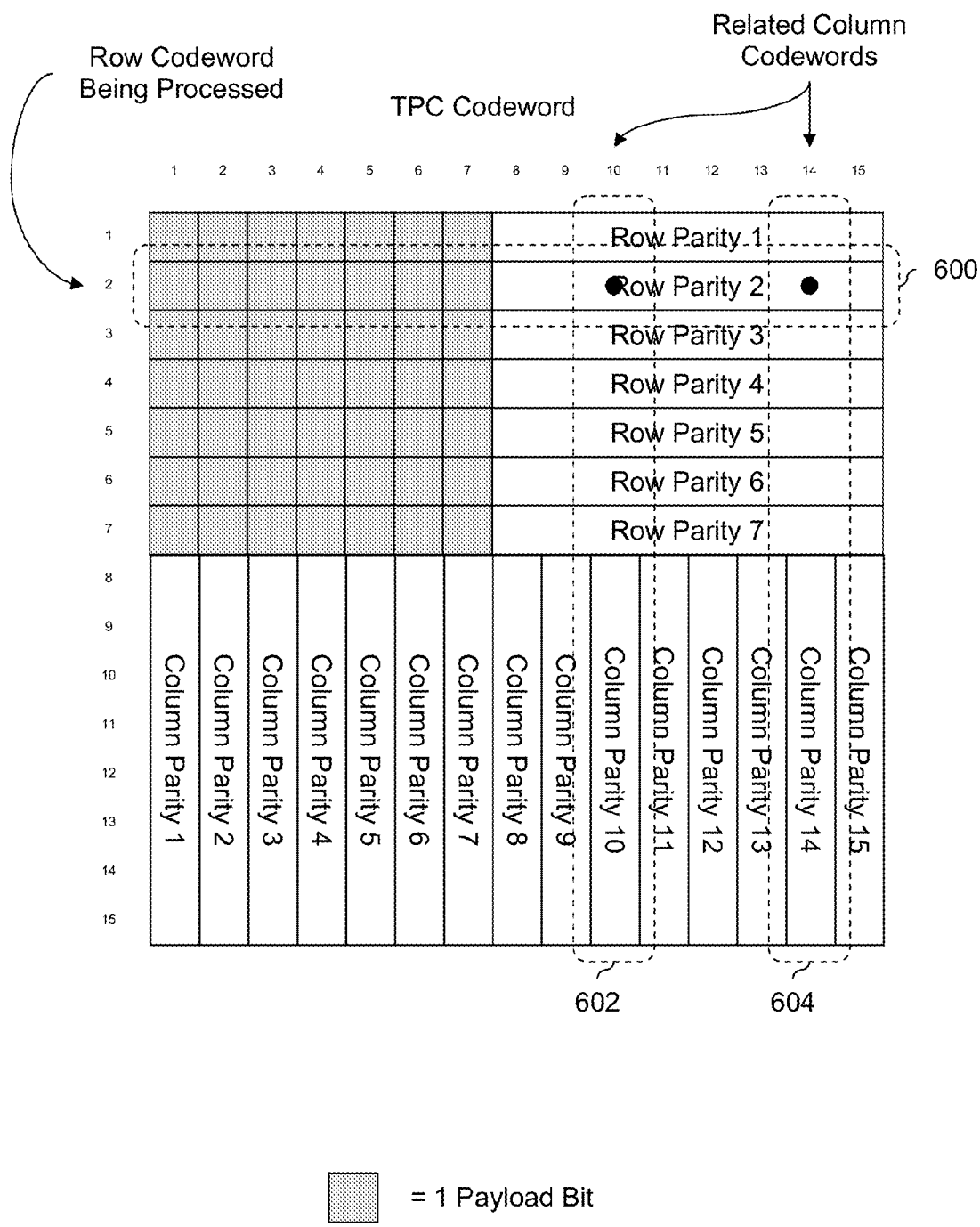
FIG. 6 is a diagram illustrating an embodiment of a TPC codeword constructed with binary BCH code.

FIG. 6 is a diagram illustrating an embodiment of a TPC codeword constructed with binary BCH code. In the example shown, codewords are constructed using a Galois Field of $GF(2^4)$, length n=15, and $t_r=t_c=2$. This exemplary TPC codeword will be used in the following examples.

FIG. 7 is a diagram illustrating an embodiment of a row syndrome buffer and a column syndrome buffer after initialization. In the example shown, row syndrome buffer 700 and column syndrome buffer 710 contain an initial set of $S_0$ and $S_2$ syndromes and an initial set of status information. In this example, we do not store the syndromes $S_1$ and $S_3$ in the syndrome buffer because the component decoders can generate them on the fly using $S_1=S_0^2$ and $S_3=S_1^2$. For example, the initialization process shown in FIG. 5 may have populated row syndrome buffer 700 and column syndrome buffer 710 as shown. In this particular example, since a binary BCH code was used to generate the TPC codeword (see FIG. 5), it is possible to store only the even syndromes. In general, for a binary BCH code, it is possible for a component syndrome buffer to store only t component syndromes per record, as opposed to 2t component syndromes per record.

The initialization process populates row syndrome buffer 700 and column syndrome buffer 710 with an initial set of row syndromes and an initial set of column syndromes, respectively. In some cases, the syndromes in a particular record are all 0s. For those records, the error free bit is set to 1. If the syndromes in a given record are not all 0s, then the error free bit is set to 0.

The initialization process also sets all of the modified bits in row syndrome buffer 700 and column syndrome buffer 710 to 1. A component decoder, such as a row decoder or a column decoder, will use the modified bits and the error free bits to determine whether to process the syndromes contained within a particular record. This is described in further detail below.

Figure 8:
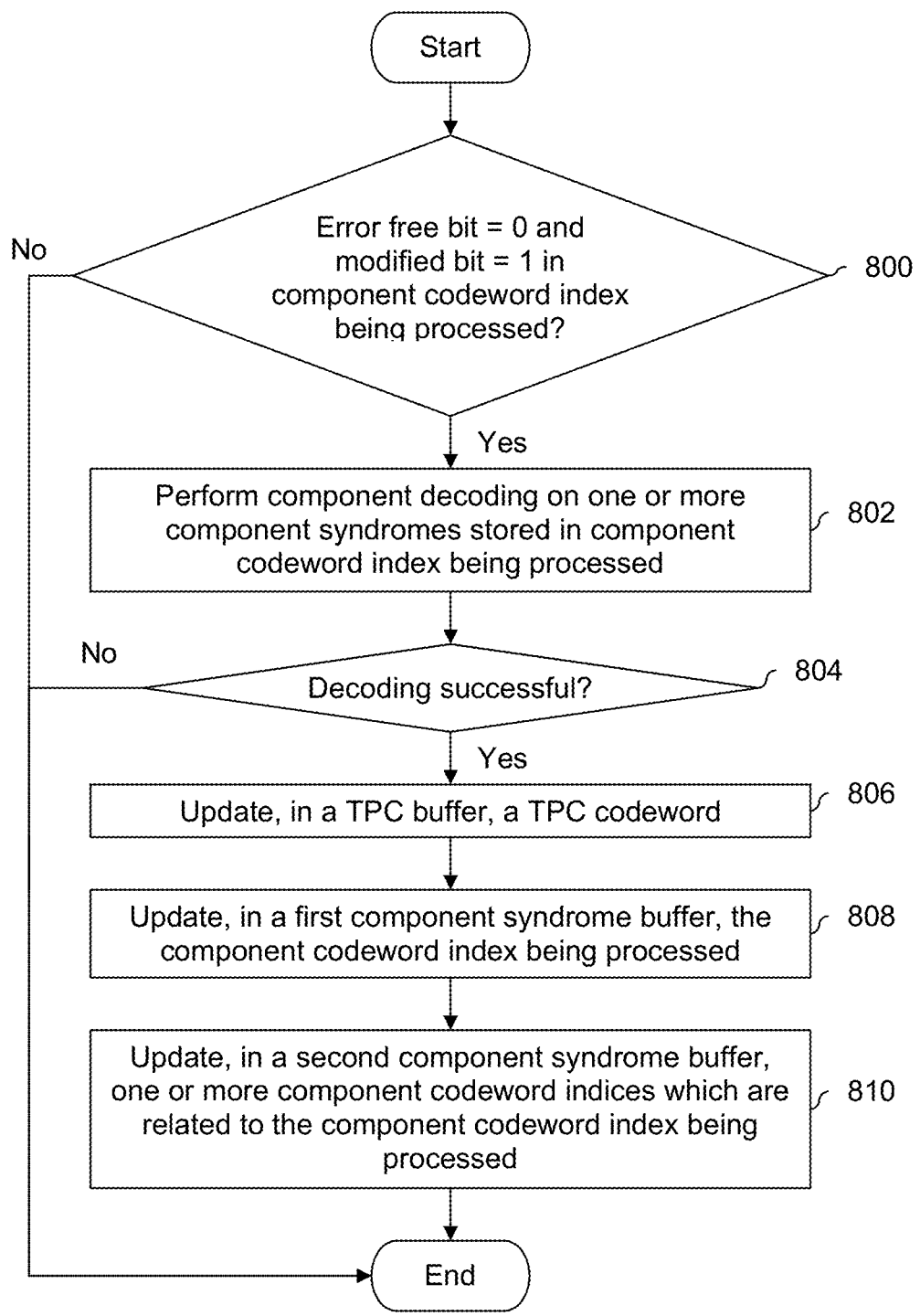
FIG. 8 is a flowchart illustrating an embodiment of a process for component decoding which is performed on a component codeword index being processed.

FIG. 8 is a flowchart illustrating an embodiment of a process for component decoding which is performed on a component codeword index being processed. In some embodiments, step 102 in FIG. 1 includes the process of FIG. 8. In various embodiments, the process is performed by a component decoder, such as a row decoder (e.g., row decoder 306 in FIG. 3) or a column decoder (e.g., column decoder 308 in FIG. 3). Using FIG. 7 as an example, the process of FIG. 8 may be performed on each of the 7 row codeword indices in row syndrome buffer 700, or the process of FIG. 8 may be performed on each of the 15 column codeword indices in column syndrome buffer 710.

At 800, it is determined if an error free bit is a 0 and a modified bit is a 1 in a component codeword index being processed. For example, suppose the $2^{nd}$ row codeword index (702) in FIG. 7 is the component codeword index being processed. In that example, the decision at 800 is Yes.

If the error free bit is a 0 and a modified bit is a 1, then component decoding is performed on one or more component syndromes stored in the component codeword index being processed. For example, the row syndromes stored in the $2^{nd}$ row codeword index (702) in FIG. 7 are processed by the row decoder.

At 804, it is determined if decoding is successful. For example, a row decoder or a column decoder may output a success/fail bit and this bit is used at step 804. Another way of describing the decision at 804 is deciding whether to commit any changes to the relevant TPC codeword, row syndromes, and/or column syndromes associated with the component codeword index being processed.

If it is determined that decoding is successful at step 804, then at 806 in a TPC buffer, a TPC codeword is updated. For example, if the $2^{nd}$ row codeword index (702) in FIG. 7 is the component codeword index being processed, then the TPC codeword is updated by way of the $2^{nd}$ row codeword (600) in FIG. 6.

At 808, in a first component syndrome buffer, the component codeword index being processed is updated. To continue the example where the $2^{nd}$ row codeword index (702) in FIG. 7 is the component codeword index being processed, the $2^{nd}$ row codeword index is updated. This includes updating row syndromes stored in the $2^{nd}$ row codeword index and the error free bit in the $2^{nd}$ row codeword index as appropriate.

At 810, in a second component syndrome buffer, one or more component codeword indices which are related to the component codeword index being processed are updated. For example, FIG. 6 shows that the 2nd row codeword (600) is related to the $10^{th}$ column codeword (602) and the $14^{th}$ column codeword (604) by way of the TPC code (represented by dots at the intersections). As an example of step 810, column syndromes and status information stored in a $10^{th}$ and $14^{th}$ column codeword indices are updated as appropriate.

Taking a step back, it is noted that results from the component decoding (performed at step 802) are not permitted to be passed on or committed unless decoding is successful (e.g., decided at step 804). This is because some component decoders (e.g., a BCH decoder) may have two parts to the output. The first part of the output contains the potential locations of errors, and the second part of the output indicates whether the component decoder was successful or not. In some cases, some of the potential error locations become available before the success/failure status is available. If the component decoder is successful, then the potential error locations are the places where the component codeword deviates from an error-free codeword. On the other hand, if the component decoder is unsuccessful, the potential error locations are not indicative of anything useful and must be discarded.

Figure 9:
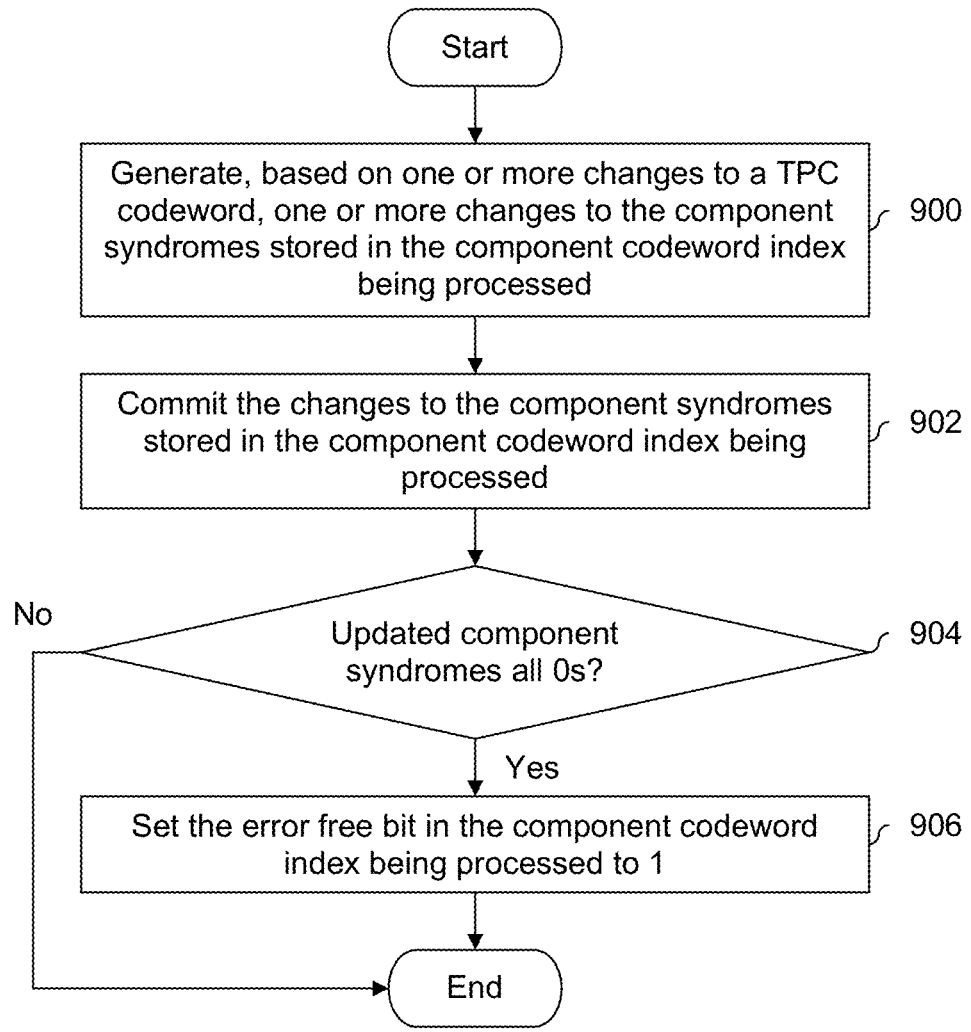
FIG. 9 is a flowchart illustrating an embodiment of a process for updating, in a first component syndrome buffer, a component codeword index being processed.

FIG. 9 is a flowchart illustrating an embodiment of a process for updating, in a first component syndrome buffer, a component codeword index being processed. In some embodiments, step 808 in FIG. 8 is performed as shown. Generally speaking, if row (column) decoding is being performed (e.g., in FIG. 8), then FIG. 9 is associated with updates to (as/if needed) a row (column) codeword index.

At 900, one or more changes to the component syndromes stored in the component codeword index being processed are generated based on one or more changes to a TPC codeword. For example, if row decoding is being performed, a row decoder may output an error vector which is to be XORed with a row codeword in order to produce an updated row codeword. The error vector may be used to generate one or more changes (e.g., also to be XORed) to a row syndrome stored in a row codeword index being processed. For example, the changes to be XORed with the $2^{nd}$ row codeword (600) in FIG. 6 would be used to generate changes to be XORed with $S_0$ and $S_2$ in the $2^{nd}$ row codeword index (702) in FIG. 7.

At 902, the changes are committed to the component syndromes stored in the component codeword index being processed. For example, a read, XOR, and write sequence may be performed on the $S_0$ and $S_2$ syndromes in the $2^{nd}$ row codeword index (702) in FIG. 7. Note that changes to a syndrome (in general) are on the symbol level. If the syndrome is m bits long, the change is also m bits long. The new syndrome is bit-wise XOR of the old syndrome and the change. Also, in some applications it is not possible to address an individual bit in the buffer. If so, the changes are based on the addressability of the buffer (e.g., 1, 2, or 4 bytes) and (as described above) the changes may be updated on using a bit-wise XOR operation.

At 904, it is determined if the updated component syndromes are all 0s. For example, if the updated $S_0$ and $S_2$ syndromes stored in the $2^{nd}$ row codeword index are all 0s, then the decision at 904 is Yes. If so, the error free bit in the component codeword index being processed is set to 1 at 906. For example, the error free bit in the $2^{nd}$ row codeword index (702) in FIG. 7 would be set to 1. Note that the default or already-stored value of the error free bit may be 0, so the No path at step 904 may maintain an error free value of 0.

Although not shown in FIG. 9, after all of the component codeword indices in the first component buffer have been processed, a process may set all of the modified bits to 0 in the first component buffer. For example, if row (column) decoding is being performed, all of the modified bits in the row (column) syndrome buffer may be set to 0 after all row (column) decoding has completed but before column (row) decoding starts.

Figure 10:
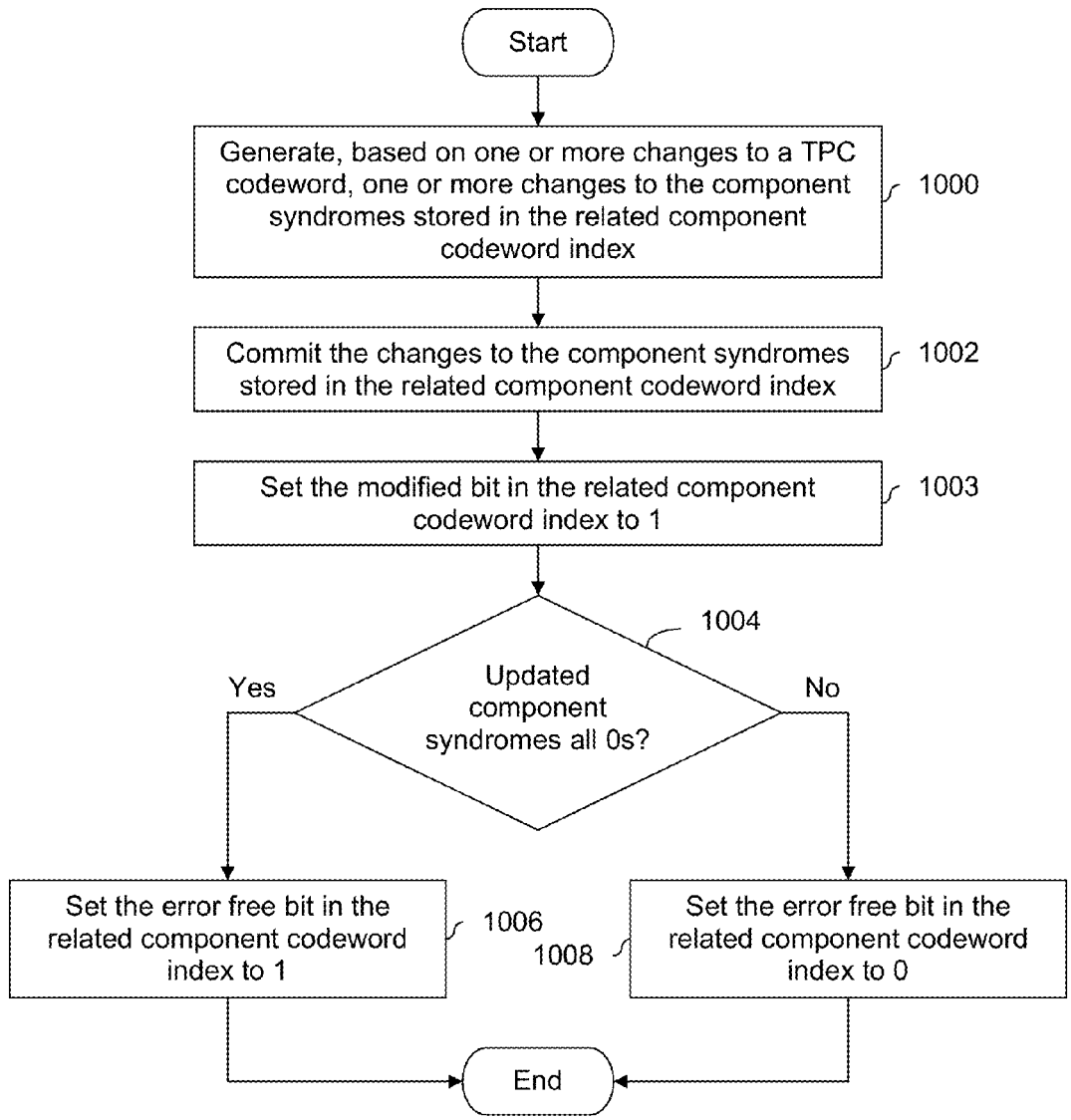
FIG. 10 is a flowchart illustrating an embodiment of a process for updating, in a second component syndrome buffer, one or more component codeword indices which are related to the component codeword index being processed.

FIG. 10 is a flowchart illustrating an embodiment of a process for updating, in a second component syndrome buffer, one or more component codeword indices which are related to the component codeword index being processed. In some embodiments, step 810 in FIG. 8 is performed as shown. Generally speaking, if row (column) decoding is being performed (e.g., in FIG. 8), then FIG. 10 is associated with updates to (as/if needed) a related column (row) codeword index. If two or more column (row) codewords are related to a single row (column) codeword, then the process of FIG. 10 may be repeated as many times as needed. For example, the $10^{th}$ and $14^{th}$ column codewords are related to the $2^{nd}$ row codeword in FIG. 6. The process of FIG. 10 would be performed twice: once to update the $10^{th}$ column codeword index and a second time to update the $14^{th}$ column codeword index.

At 1000, one or more changes to the component syndromes stored in the related component codeword index are generated, based on one or more changes to a TPC codeword. To continue the examples from above, the changes to be XORed with the $2^{nd}$ row codeword (600) in FIG. 6 may be used to generate changes to be XORed with syndromes in the $10^{th}$ or the $14^{th}$ column codeword indices in FIG. 7.

At 1002, the changes are committed to the component syndromes stored in the related component codeword index. As described above, a read, XOR, and write process may be used.

At 1003, the modified bit in the related component codeword index is set to 1. Note that FIG. 9 did not have a corresponding step which set the modified bit to 1. This is because the modified bits in a given component syndrome buffer are asserted (e.g., set to 1) by the other component decoder. For example, the row (column) decoder is responsible for asserting the modified bits in the column (row) syndrome buffer. This enables the column (row) decoder to know what syndromes were updated by the row (column) decoder in the iteration immediately before.

At 1004, it is determined if the updated component syndromes are all 0s. If so, the error free bit in the related component codeword index is set to 1 at 1006. If not, the error free bit in the related component codeword index is set to 0 at 1008. Note that there is a (subtle) difference between FIGS. 9 and 10 with respect to the necessity of setting the error free bit to 0. In FIG. 9, the error free bit is already set to 0. This is because the component codeword is processed only if the error free bit is set to 0 (see, e.g., step 800 in FIG. 8 where FIG. 9 shows one embodiment of step 808). So, at step 904 in FIG. 9 it is not necessary to do anything because the error free bit is already set to 0. In FIG. 10, however, the related component codeword can have the error free bit set to either 0 or 1. So, in FIG. 10, the error free bit is explicitly set to 0 at step 1008 (since it is possible that it can be a 1).

The following describes the processing of FIGS. 8-10 when applied to FIG. 7. In the example below, a row decoder is performing row decoding, and the records in row syndrome buffer 700 are gone through from top to bottom.

Row codeword index 1 (701): the row syndromes in this record are not processed since the error free bit is set to 1, indicating that the associated row codeword contains no errors and further correction is not required.

Row codeword index 2 (702): the row syndromes in this record are processed since the modified bit is set to 1 and the error free bit is set to 0. Row decoding is performed on the row syndromes contained in the second row codeword index (702) and the row decoding in this particular case is successful. Since row (column) decoding was successful in this instance, the row (column) decoding results are permitted to be passed along. Conversely, row (column) decoding results would not be permitted to be passed along had row (column) decoding not been successful. Successful row (column) decoding triggers a number of processes to begin and/or updates to row syndrome buffer 700 and/or column syndrome buffer 710, including:

Update the column syndromes in the $10^{th}$ column codeword index (716) the $14^{th}$ column codeword index (712). In this exemplary TPC code construction, the $2^{nd}$ row codeword is tied to the $10^{th}$ and $14^{th}$ column codewords, so new column syndromes are generated for the $10^{th}$ and $14^{th}$ column codeword indices and committed to column syndrome buffer 710.

The modified bits in the $10^{th}$ column codeword index (716) and the $14^{th}$ column codeword index (712) are set to 1. This lets the column decoder know (at the next iteration) that the row decoder has updated the column syndromes in the $10^{th}$ column codeword index (716) and the $14^{th}$ column codeword index (712). In this particular instance it is a moot point since the initialization process has already set all modified bits in column syndrome buffer 710 to 1, but in other decoding iterations, the modified bits are cleared or reset to 0.

In this particular case, the updated column syndromes generated for the $14^{th}$ column codeword index (712) are all 0s, so the $14^{th}$ column codeword can be considered error free:

The error free bit in the $14^{th}$ column codeword index (712) is set to 1.

Since the $2^{nd}$ row codeword can now be considered error free:

The row syndromes in the $2^{nd}$ row codeword index (702) are set to all 0s and the error free bit in the $2^{nd}$ row codeword index (702) is set to 1.

Row codeword index 3 (703) and row codeword index 4 (704) are not processed since the error free bits are set to 1.

Row codeword index 5 (705): the row syndromes in this record are processed since the modified bit is set to 1 and the error free bit is set to 0. In this particular case, row decoding is not successful (e.g., a failure signal was asserted by the row or column decoder). As such, no changes are made to the $5^{th}$ row codeword index (705). Any updates which were generated are discarded and are not committed (e.g., to the TPC buffer, to the row syndrome buffer, to the column syndrome buffer, etc.).

Row codeword index 6 (706): the row syndromes in this record are not processed since the error free bit is set to 1.

Row codeword index 7 (707): the row syndromes in this record are processed since the modified bit is set to 1 and the error free bit is set to 0. Row decoding is successful in this case, so the following updates and processes are performed.

One or more of the column syndromes in the $13^{th}$ column codeword index (714) are updated. In this example, the $7^{th}$ row codeword is related to the $13^{th}$ column codeword, so updated column syndromes are generated for the $13^{th}$ column codeword index (714) and saved therein.

The modified bit in the $13^{th}$ column codeword index (714) is set to 1. This lets the column decoder know during the next iteration that the row decoder updated one or more codewords stored in the $13^{th}$ column codeword index (714).

The error free bit in the $13^{th}$ column codeword index (714) is set to 1. In this particular case, the updated column syndromes generated for the $13^{th}$ column codeword index are all 0s, so the $13^{th}$ column codeword is successfully decoded.

The error free bit in the $7^{th}$ row codeword index (707) set to 1 and the row syndromes for the $7^{th}$ row codeword index (707) are set to 0. This lets the row decoder know on the next iteration (if needed) that further decoding is unnecessary.

After all of the records in row syndrome buffer 700 have been evaluated and processed (if needed), the modified bits in row syndrome buffer 700 are all set to 0. This resets the modified bits so that only those records in row syndrome buffer 700 that are updated during the upcoming column decoding will be processed during the second iteration of row decoding.

The following figure shows FIG. 7 after the processing described above has been performed.

FIG. 11 is a diagram illustrating an embodiment of a row syndrome buffer and a column syndrome buffer after a first iteration of row decoding but before a first iteration of column decoding. FIG. 11 continues the example of FIG. 7. In the example shown, fields which have changed between FIGS. 7 and 11 are indicated with an asterisk (*). For brevity, the syndrome fields are not shown herein.

In row syndrome buffer 1100, all of the modified bits have been changed from 1 to 0. As described above, this resets row syndrome buffer 1100 so that the row decoder knows (during the next row decoding iteration) which records were modified by the column decoder and thus which row syndromes should be processed (if needed).

In the $2^{nd}$ row codeword index (1102) and the $7^{th}$ row codeword index (1104), the error free bits have been changed from 0 to 1 because decoding was successful for those row codewords. Note that the error free bit in the $5^{th}$ row codeword index (1106) was not changed and remains a 0 because row decoding was not successful (as described above).

In column syndrome buffer 1110, the column syndromes and error free bits in the $13^{th}$ column codeword index (1123) and the $14^{th}$ column codeword index (1124) have been updated. More specifically, the stored column syndromes in those records are all 0s and the error free bits are set to 1.

Using the information shown in column syndrome buffer 1110, a column decoder performs a first iteration of column decoding. The following describes the processing of FIGS. 8-10 performed on FIG. 11 by a column decoder during a first column decoding iteration.

Column codeword index 1 (1111) and column codeword index 2 (1112) are not processed since the error free bits are set to 1.

Column codeword index 3 (1113): column decoding is performed on the column syndromes in the $3^{rd}$ column codeword index (1113) and decoding is successful. Since all errors have been removed from the $3^{rd}$ column codeword The error free bit in the $3^{rd}$ column codeword index (1113) is set to 1 and the column syndromes for the $3^{rd}$ column codeword index are set to all 0s.

In this particular example there are no related row codewords since only the first seven bits of the column codewords have an associated row codeword. The error occurs in bit 13, which doesn't have an associated row codeword, so no updates are made to row syndrome buffer 1100.

Column codeword index 4 (1114), column codeword index 5 (1115), and column codeword index 6 (1116) are not processed since the error free bits are set to 1.

Column codeword index 7 (1117): column decoding is performed on the column syndromes in the $7^{th}$ column codeword index (1117) and decoding is successful.

The row syndromes in the $5^{th}$ row codeword index (1106) are updated. In this example, the $7^{th}$ column codeword is related to the 5$^{th}$ row codeword and so new column syndromes are generated for the 5$^{th}$ row codeword index (1106) and saved therein.

The modified bit in the 5$^{th}$ row codeword index (1106) is set to 1. This is to indicate to the row decoder that the column decoder updated the syndromes in the 5$^{th}$ row codeword index (1106).

Since all errors have been removed from the 7$^{th}$ column codeword,

The error free bit in the 7$^{th}$ column codeword index (1117) is set to 1, and the column syndromes for the 7$^{th}$ column codeword are set to all 0s.

In this example, the updated row syndromes generated for and saved to the 5$^{th}$ row codeword index (1106) are not all 0s, so the error free bit in the 5$^{th}$ row codeword index (1106) is set to 0. As described above, the error free bit may be either a 0 or a 1, so the error free bit is explicitly set to the correct value since no assumption can be made about the value.

Column codeword index 8 (1118): column decoding is performed on the column syndromes in the 8$^{th}$ column codeword index (1118) and decoding is successful. Since all errors have been removed from the 8$^{th}$ column codeword, The error free bit in the 8$^{th}$ column codeword index (1118) is set to 1, and the column syndromes for the 8$^{th}$ column codeword index are set to all 0s.

In this particular example, there is no related row codeword (bit 13 again contains the error and there is no associated row codeword) so row syndrome buffer 1100 is not updated.

Column codeword index 9 (1119) is not processed since the error free bit is set to 1.

Column codeword index 10 (1120): column decoding is performed on the column syndromes in the 10$^{th}$ column codeword index (1120) and decoding is successful.

The syndromes in the 5$^{th}$ row codeword index (1106) are updated. In this example, the 10$^{th}$ column codeword is related to the 5$^{th}$ row codeword (which has yet to be successfully decoded) so updated row syndromes are generated for and saved to the 5$^{th}$ row codeword index (1106).

The modified bit in the 5$^{th}$ row codeword index (1106) is set to 1. (Note that this bit was already one because of the processing associated with the 7$^{th}$ column codeword index (1117). This is merely described for completeness.) This reflects the updated row syndromes saved to the 5$^{th}$ row codeword index (1106).

Since all the errors have been removed from the 10$^{th}$ column codeword,

The error free bit in the 10$^{th}$ column codeword index (1120) is set to 1, and the column syndromes of the 10$^{th}$ column codeword index are set to all 0s.

In this particular example, the updated row syndromes generated for the 5$^{th}$ row codeword index (1106) are still not all 0s, so the error free bit in the 5$^{th}$ row codeword index (1106) is set to 0 again.

Column codeword index 11 (1121) is not processed since that error free bit is set to 1.

Column codeword index 12 (1122): column decoding is performed on the column syndromes in the 12$^{th}$ column codeword index (1122) and decoding is successful.

The error free bit in the 12$^{th}$ column codeword index (1122) is set to 1, and the column syndromes for the 12$^{th}$ column codeword index are set to all 0s.

In this particular case, the error was located in the 14$^{th}$ bit, which does not have a corresponding row codeword. As such, row syndrome buffer 1100 is not updated.

Column codeword index 13 (1123) and column codeword index 14 (1124) are not processed since the error free bits are set to 1.

Column codeword index 15 (1125): column decoding is performed on the column syndromes in the 15$^{th}$ column codeword index (1125) and the decoding is successful.

The error free bit in the 15$^{th}$ column codeword index (1125) is set to 1, and the column syndromes in the 15$^{th}$ column codeword index are set to all 0s.

The syndromes in the 5$^{th}$ row codeword index (1106) are updated. In this example, the 15$^{th}$ column codeword is related to the 5$^{th}$ row codeword (which has yet to be successfully decoded) so updated syndromes are generated for the 5$^{th}$ row codeword index (1106).

The modified bit in the 5$^{th}$ row codeword index (1106) is set to 1.

The updated row syndromes generated for the 5$^{th}$ row codeword index (1106) are finally all 0s, so the following update is also performed.

The error free bit in the 5$^{th}$ row codeword index (1106) is set to 1.

After all of the records in column syndrome buffer 1110 have been processed (if needed), the modified bits in column syndrome buffer 1110 are all set to 0.

The following figure shows FIG. 11 after the above processing has been performed.

FIG. 12 is a diagram illustrating an embodiment of a row syndrome buffer and a column syndrome buffer after a first iteration of column decoding but before a second iteration of row decoding. FIG. 12 continues the example of FIG. 11. In the example shown, fields which have changed between FIGS. 11 and 12 are indicated with an asterisk (*).

In column syndrome buffer 1210, all of the modified bits are set to 0. This resets column syndrome buffer 1210 and lets the column decoder know (e.g., during a next row decoding iteration) which of the records were updated by the row decoder.

Also in column syndrome buffer 1210, the updated column syndromes (not shown) generated for column codeword indices 1211-1216 were all 0s so the error free bits in those records have also been updated from 0 to 1.

After multiple updates during column decoding, the updated row syndromes (not shown) associated with the 5$^{th}$ row codeword index (1202) eventually became all 0s. As a result, the error free bit for the 5$^{th}$ row codeword index (1202) has been updated from 0 to 1.

Note that in the state shown, all of the error free bits in row syndrome buffer 1200 and column syndrome buffer 1210 are set to 1. As such, no further decoding is required since the TPC codeword has been successfully decoded.

Returning to FIG. 3, a TPC decoder may include other components in addition to or as an alternative to those shown in FIG. 3. The following figure shows a second embodiment of a TPC decoder with more components.

Figure 13:
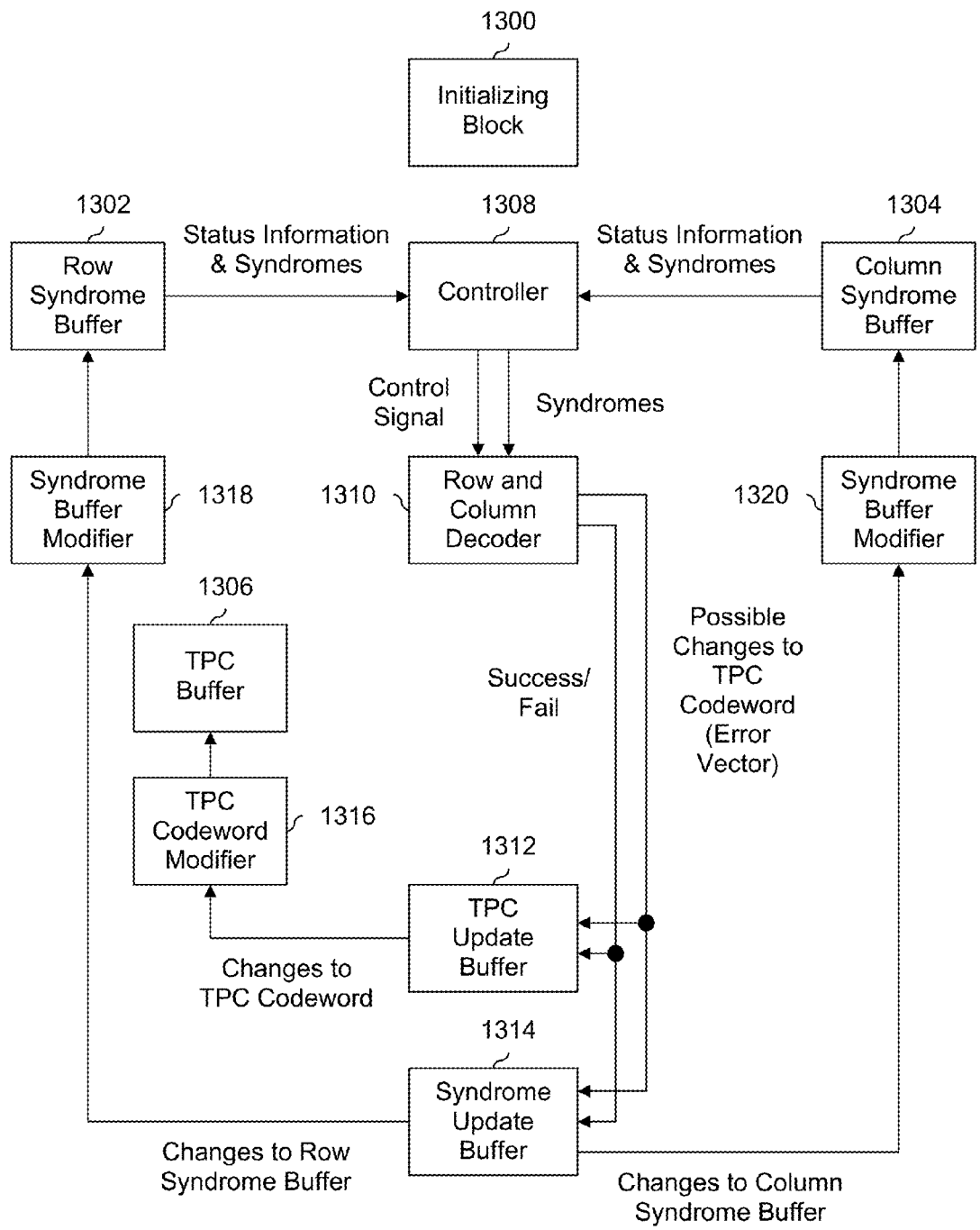
FIG. 13 is a diagram illustrating a second embodiment of a TPC decoder.

FIG. 13 is a diagram illustrating a second embodiment of a TPC decoder. As described above, the exemplary TPC decoder may be implemented as a semiconductor device, such as an ASIC or FPGA. To preserve readability, storage 300 and read controller 302 shown in FIG. 3 are not shown in this figure.

In the example shown, initializing block 1300 is responsible for initializing the TPC decoder when decoding of a new TPC codeword begins. Initial row syndromes and initial column syndromes are generated for and saved to row syndrome buffer 1302 and column syndrome buffer 1304, respectively. For those row codewords or column codewords where the corresponding syndromes are all 0s, the error free bit is set to 1 by initializing block 1300. If not, the error free bit is set to 0 by initializing block 1300.

In addition to initializing the syndromes and error free bits in row syndrome buffer 1302 and column syndrome buffer 1304, initializing block 1300 sets the modified bits to 1 in row syndrome buffer 1302 and column syndrome buffer 1304. Setting all of the modified bits to 1 is acceptable during initialization because the corresponding error free bit will cause row and column decoder 1310 to skip records in row syndrome buffer 1302 or column syndrome buffer 1304 where the row codeword or column codeword has been successfully decoded.

Initializing block 1300 is also responsible for initializing TPC buffer 1306, which is used to store the TPC codeword. Initializing block 1300 does this by copying the TPC codeword (e.g., received from storage) to TPC buffer 1306. In various embodiments, TPC buffer 1306 may be a byte or word addressable RAM. To put it another way, TPC buffer 1306 may be divided into 8-bit, 16-bit, or 32-bit units which can be accessed one unit per clock cycle. As TPC decoding progresses, errors (if any) within the TPC codeword are corrected by flipping bits in TPC buffer 1306 (e.g., after ensuring a potential change should be committed to TPC buffer 1306).

Once initialization is complete, controller 1308 takes over. Controller 1308 obtains status information (e.g., error free bits and modified bits) and (assuming row decoding goes first) row syndromes from row syndrome buffer 1302. Based on the error free bits and modified bits, controller 1308 passes along the appropriate syndromes to row and column decoder 1310 for processing and signals which component decoder is active. For example, the control signal passed from controller 1308 to row and column decoder 1310 may indicate (in this case at least) that the row decoder is active. The syndromes which are passed from controller 1308 to row and column decoder 1310 in this example would correspond to the row syndromes from row syndrome buffer 1302 which have an error free bit of 0 and a modified bit of 1.

In response to the control signal from controller 1308, row and column decoder 1310 will perform row decoding. Row and column decoder 1310 passes possible changes to the TPC codeword, for example in the form of an error vector to be XORed with a row codeword or a column codeword. Using these changes to the TPC codeword, syndrome update buffer 1314 generates and stores possible changes to the row and column syndrome buffer.

The possible changes are held in TPC update buffer 1312 or syndrome update buffer 1314 until it is known whether a given change should actually be made (or not). The possible changes which are passed from row and column decoder 1310 to TPC update buffer 1312 and syndrome update buffer 1314 may also be referred to as an error vector or an update vector. For example, an error vector may have a 1 at the error locations and a 0 where there is no error, so that an XOR with the codeword (other piece of information being corrected) will cause the identified errors to be fixed by flipping them.

The reason why this wait is required (at least in some embodiments) relates to the BMA block and the CS block in row and column decoder 1310. As described above, the BMA block and the CS block work to find the roots of the error locator polynomial, which is equivalent to identifying which locations in the codeword (a row codeword, in this example) have an error and should be flipped from a 1 to a 0 or vice versa. Row and column decoder 1310 is unable to successfully decode a codeword because of either the following reasons:

The BMA block generates an error locator polynomial with degree d>t, where t is the maximum correction capability of the component code. Since at most t bits can be corrected (but the degree of the error locator polynomial indicates that there are more than t errors), decoding fails.

The BMA block generates an error locator polynomial with degree d≤t (meaning that the BMA block thinks decoding is possible), but the CS block does not find d roots in GF($2^m$). This error case occurs when the error locator polynomial has roots in an extension of GF($2^m$) and a decoding failure is declared.

Examining the second failure scenario in more detail, although possible changes may be output over a period of time, until the CS block has completed, it cannot be known if the second failure scenario has occurred or not. This is why the possible changes are stored in TPC update buffer 1312 and syndrome update buffer 1314 until it is known whether decoding is successful and a particular change can actually be committed. Note that for performance reasons, the possible changes are generated ahead of time (e.g., before it is known whether or not the changes should be committed). Performance would not be as good if the changes to be applied were generated only after it was known that a change could actually be committed.

In one example of the format of TPC update buffer 1312, TPC update buffer 1312 contains two fields: the write address (e.g., of the byte, word, dword, etc.) in TPC buffer 1306 which is to be modified and an error vector which is to be XORd with the data stored at the specified write address to obtain the new TPC codeword. In some embodiments, the specified write address only contains a part of the TPC codeword. For example, the write address may be a byte, word, or dword, while the TPC codeword may be several thousands of bytes. Note that it is not necessary for TPC update buffer 1312 to be the same size as TPC buffer 1306 and in fact it may actually be smaller, which is desirable.

TPC codeword modifier 1316 is responsible for actually making the changes to TPC buffer 1306. A pseudo code example of the operations performed by TPC codeword modifier 1316 on TPC buffer 1306 is: read_data=READ(<write_address>); write_data=XOR(read_data, <error_vector>); WRITE(<write_address>, write_data). As described above, a given change is not actually committed to a relevant row (column) codeword in TPC buffer 1306 unless decoding of that row (column) codeword is successful.

In one example of the format of syndrome update buffer 1314, syndrome update buffer 1314 contains three fields: a row/column bit (e.g., set to 0 during row decoding and 1 during column decoding), an index or address of the row or column codeword which is being decoded, and an error vector. As described above, the changes stored in syndrome update buffer 1314 are not actually committed to row syndrome buffer 1302 and column syndrome buffer 1304 until row (column) decoding succeeds.

Syndrome buffer modifier 1318 and syndrome buffer modifier 1320 are responsible for actually making the changes to row syndrome buffer 1302 and column syndrome buffer 1304, respectively. Based on the value of the row/column bit in syndrome update buffer 1314, syndrome buffer modifier 1318 will know which changes it is responsible for (i.e., those with the row/column bit set to 0) and syndrome buffer modifier 1320 will know which changes it is responsible for (i.e., those with the row/column bit set to 1). As described above, a three step process of reading, XORing, and writing may be used to make a change to syndrome buffers 1302 and 1304. Also, as described above, if the second failure scenario described above occurs (i.e., the CS block is unable to find all roots of a given error location polynomial), then the changes in syndrome update buffer 1314 corresponding to that error location polynomial are not committed to the appropriate syndrome buffer.

In addition to updating syndromes in syndrome buffers 1302 and 1304, syndrome buffer modifiers 1318 and 1320 are also responsible for updating the status information (e.g., error free bits and modified bits) stored therein. In some embodiments, syndrome buffer modifiers 1318 and 1320 are "dumb" modules and the information stored in syndrome update buffer 1314 specifies the updated values of the error free bit and modified bit for a given record.

Once row decoding has completed and the appropriate changes have been made to the buffers (i.e., row syndrome buffer 1302, column syndrome buffer 1304, and TPC buffer 1306), column decoding begins. Column decoding is similar to row decoding and for brevity is not described herein.

Component decoding (i.e., row decoding and column decoding) will continue on until either a maximum number of iterations is reached, or the component syndromes indicate all of the component codewords have been successfully decoded. Should that occur, the corrected TPC codeword in TPC buffer 1306 is output.

Note that although FIG. 13 shows only a single component decoder (i.e., row and column decoder 1310), some other embodiments may have multiple component decoders (e.g., so row (column) syndromes associated with different row (column) syndromes may be processed in parallel). This may be attractive because loading syndromes into a component decoder takes a relatively small amount of time compared to the actual decoding process so it would be desirable to have multiple component decoders going simultaneously. It is noted that during a row (column) decoding iteration, each row (column) codeword may be decoded independently of one another.

The following figure describes a process for updating a TPC codeword stored in a TPC buffer. As described above, possible changes are held until it is certain that a particular change should actually be committed to the TPC buffer.

Figure 14:
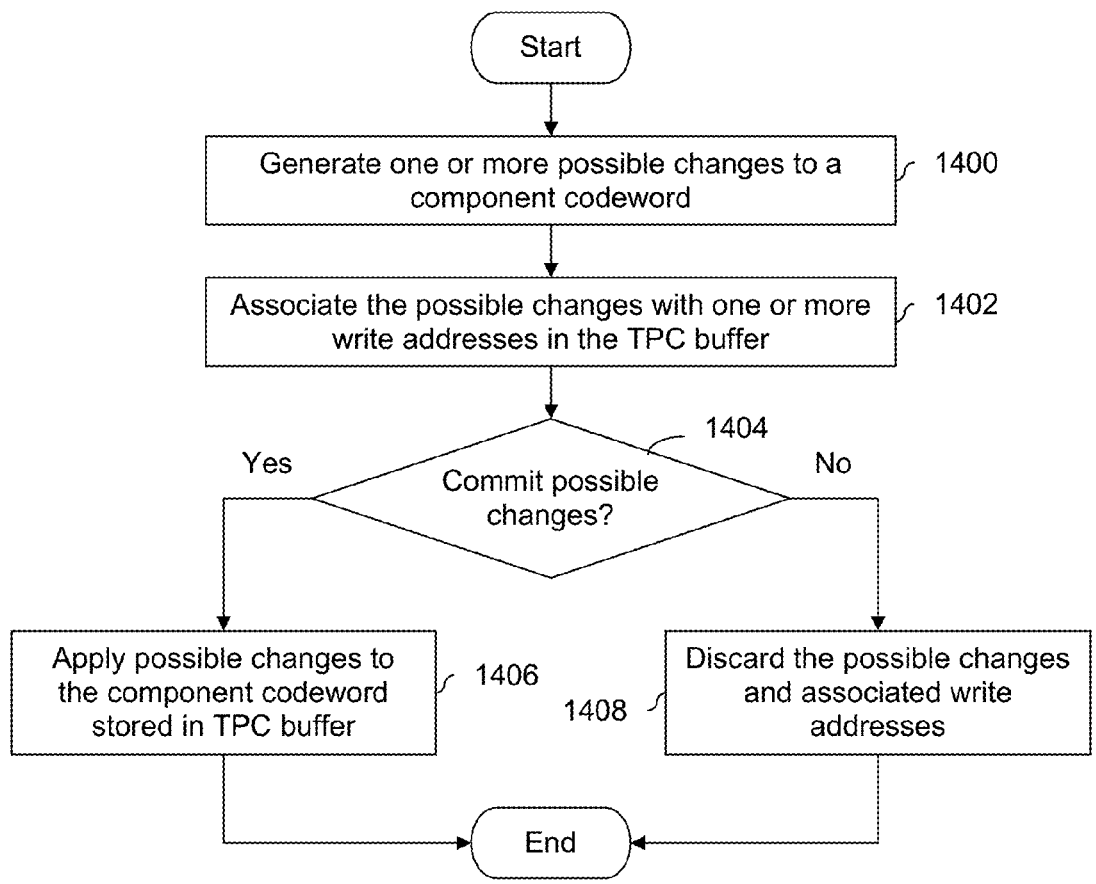
FIG. 14 is a flowchart illustrating an embodiment of a process for updating a TPC codeword stored in a TPC buffer.

FIG. 14 is a flowchart illustrating an embodiment of a process for updating a TPC codeword stored in a TPC buffer. In some embodiments, step 806 in FIG. 8 is performed as shown.

At 1400, one or more possible changes to a component codeword are generated. For example, in the case of a binary BCH TPC codeword, the possible changes may comprise one or more error vectors where a 1 indicates an error in that bit location which needs to corrected and a 0 indicates no error in that bit correction. The actual correction may be made (if appropriate) by XORing the error vectors with the corresponding parts a stored component codeword so that the bits in the error locations are flipped (which is the same thing as correcting those bits). In FIG. 13, possible changes are passed from row and column decoder 1310 to TPC update buffer 1312.

At 1402, the possible changes are associated with one or more write addresses in the TPC buffer. For example, each entry in TPC update buffer 1312 in FIG. 13 may include a write address field and an error vector which is to be applied at the specified write address.

At 1404 it is determined whether to commit the possible changes. As described above, in some embodiments, this includes waiting for component decoding to conclude so that it is known if the CS block was able to locate all roots of the error locator polynomial. If the CS block is not able to locate all roots of the error locator polynomial, then the decision at step 1404 is No.

If the decision at step 1404 is Yes, then at 1406 the possible changes are applied to the component codeword stored in the TPC buffer. For example, in FIG. 13, step 1404 is performed by TPC codeword modifier 1316 using the information stored in TPC update buffer 1312 in order to make changes to a column codeword or a row codeword stored in TPC buffer 1306. If it is decided at step 1404 to not commit the possible changes, the possible changes and associated write addresses are discarded at 1408.

In various embodiments, application of the changes at step 1406 is triggered by one of a variety of events occurring or conditions being satisfied. In one example, the changes in TPC update buffer 1312 in FIG. 13 are committed (for those records where it is known they can be committed to the TPC buffer) after a given iteration of row (column) decoding has completed but before the next iteration of column (row) decoding has started. In another example, TPC update buffer 1312 is "flushed" when it starts getting full (again, where appropriate or possible).

When TPC decoding has completed, the corrected TPC codeword stored in the TPC buffer is output.

Although the examples described above describe 2D TPC codes (i.e., with row codes and column codes), the techniques described herein are applicable to TPC codes having any number of codes or dimensions. In one example, 4 4 kb 2D TPC codewords are combined and interleaved. The interleaved data is then error correction encoded with a third code, referred to as a master code, in order to generate master parity information which is stored along with the 4 4 kb 2D TPC codewords. (Typically, for a variety of cost-related reasons, the master code is not used during decoding unless other decoding techniques (e.g., which rely only upon the row codes and column codes) have failed.) The techniques described herein may be used to mitigate bottlenecks in systems which have three or more codes or dimensions. For example, there may be a master syndrome buffer which is managed and/or used in the manner described above.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:
1. A system, comprising:
a component syndrome buffer; and
a component decoder configured to:
   obtain, from the component syndrome buffer, a set of one or more component syndromes associated with a turbo product code (TPC) codeword; and
   perform component decoding on the set of one or more component syndromes,
an initializing block configured to:
   generate an initial set of one or more component syndromes using the TPC codeword;
   set the set of component syndromes in the component syndrome buffer to be the initial set of component syndromes;
   identify, based at least in part on the initial set of component syndromes, those component codewords which require no correction and those component codewords which require correction;
   set one or more error free bits based at least in part on the identification of those component codewords which require no correction and those component codewords which require correction; and set one or more modified bits to indicate that associated records have been modified.

2. The system of claim 1, wherein the system includes a semiconductor device, including one or more of the following: an application-specific integrated circuit (ASIC) or field-programmable gate array (FPGA).

3. The system of claim 1, wherein the component syndrome buffer includes one or more of the following: a row syndrome buffer, a column syndrome buffer, or a master syndrome buffer.

4. The system of claim 1, wherein the set of component syndromes includes one or more of the following: a set of one or more row syndromes, a set of one or more column syndromes, or a set of one or more master syndromes.

5. The system of claim 1, wherein the TPC codeword is associated with one or more of the following: a Bose-Chaudhuri-Hocquenghem (BCH) code or a Reed-Solomon (RS) code.

6. The system of claim 1, further comprising a TPC buffer which is configured to store the TPC codeword, wherein the initializing block is further configured to set the TPC codeword in the TPC buffer to be an initial TPC codeword copied from storage.

7. A system, comprising:
a component syndrome buffer; and
a component decoder configured to:
obtain, from the component syndrome buffer, a set of one or more component syndromes associated with a turbo product code (TPC) codeword; and
perform component decoding on the set of one or more component syndromes, wherein:
the system further includes a TPC codeword modifier and a syndrome buffer modifier;
the component decoder is configured to perform component decoding, including by:
determining if an error free bit equals 0 and a modified bit equals 1 in a component codeword index being processed; and
in the event it is determined the error free bit equals 0 and the modified bit equals 1:
performing component decoding on one or more component syndromes stored in the component codeword index being processed; and
determining if decoding is successful; and
in the event it is determined decoding is successful:
the TPC codeword modifier is configured to update, in a TPC buffer, the TPC codeword; and
the syndrome buffer modifier is configured to:
update, in a first component syndrome buffer, the component codeword index being processed; and
update, in a second component syndrome buffer, one or more component codeword indices which are related to the component codeword index being processed.

8. The system of claim 7, wherein the syndrome buffer modifier is configured to update, in the first component syndrome buffer, the component codeword index being processed, including by:
generating, based on one or more changes to the TPC codeword, one or more changes to the component syndromes stored in the component codeword index being processed;
committing the changes to the component syndromes stored in the component codeword index being processed;
determining if the updated component syndromes are all zeros; and
in the event it is determined the updated component syndromes are all zeros, setting the error free bit in the component codeword index being processed to 1.

9. The system of claim 7, wherein the syndrome buffer modifier is configured to update, in the second component syndrome buffer, one or more component codeword indices, including by:
generating, based on one or more changes to the TPC codeword, one or more changes to the component syndromes stored in the related component codeword index;
committing the changes to the component syndromes stored in the related component codeword index;
setting the modified bit in the related component codeword index to 1;
determining if the updated component syndromes are all zeros;
in the event it is determined the updated component syndromes are all zeros; setting the error free bit in the related component codeword index to 1; and
in the event it is determined the updated component syndromes are not all zeros, setting the error free bit in the related component codeword index to 0.

10. The system of claim 7, wherein the TPC codeword modifier is configured to update, in the TPC buffer, the TPC codeword, including by:
generating one or more possible changes to a component codeword;
associating the possible changes with one or more write addresses in the TPC buffer;
determining whether to commit the possible changes;
in the event it is determined to commit the possible changes, applying the possible changes to the component codeword stored in the TPC buffer; and
in the event it is determined to not commit the possible changes, discarding the possible changes and associated write addresses.

11. A method, comprising:
obtaining, from a component syndrome buffer, a set of one or more component syndromes associated with a turbo product code (TPC) codeword;
using a decoder to perform component decoding on the set of one or more component syndromes;
generating an initial set of one or more component syndromes using the TPC codeword;
setting the set of component syndromes in the component syndrome buffer to be the initial set of component syndromes;
identifying, based at least in part on the initial set of component syndromes, those component codewords which require no correction and those component codewords which require correction;
setting one or more error free bits based at least in part on the identification of those component codewords which require no correction and those component codewords which require correction; and
setting one or more modified bits to indicate that associated records have been modified.

12. The method of claim 11, wherein the method is performed by a semiconductor device, including one or more of the following: an application-specific integrated circuit (ASIC) or field-programmable gate array (FPGA).

13. The method of claim 11, wherein the component syndrome buffer includes one or more of the following: a row syndrome buffer, a column syndrome buffer, or a master syndrome buffer.

14. The method of claim 11, wherein the set of component syndromes includes one or more of the following: a set of one or more row syndromes, a set of one or more column syndromes, or a set of one or more master syndromes.

15. The method of claim 11, wherein the TPC codeword is associated with one or more of the following: a Bose-Chaudhuri-Hocquenghem (BCH) code or a Reed-Solomon (RS) code.

16. The method of claim 11, further comprising storing the TPC codeword in a TPC buffer, wherein the TPC codeword in the TPC buffer is initialized to be an initial TPC codeword copied from storage.

17. The method of claim 11, further comprising:
determining if an error free bit equals 0 and a modified bit equals 1 in a component codeword index being processed; and
in the event it is determined the error free bit equals 0 and the modified bit equals 1:
performing component decoding on one or more component syndromes stored in the component codeword index being processed;
determining if decoding is successful; and
in the event it is determined decoding is successful:
updating, in a TPC buffer, the TPC codeword;
updating, in a first component syndrome buffer, the component codeword index being processed; and
updating, in a second component syndrome buffer, one or more component codeword indices which are related to the component codeword index being processed.

18. The method of claim 17, wherein updating, in the first component syndrome buffer, the component codeword index being processed includes:
generating, based on one or more changes to the TPC codeword, one or more changes to the component syndromes stored in the component codeword index being processed;
committing the changes to the component syndromes stored in the component codeword index being processed;
determining if the updated component syndromes are all zeros; and
in the event it is determined the updated component syndromes are all zeros, setting the error free bit in the component codeword index being processed to 1.

19. The method of claim 17, wherein updating, in the second component syndrome buffer, one or more component codeword indices, includes:
generating, based on one or more changes to the TPC codeword, one or more changes to the component syndromes stored in the related component codeword index;
committing the changes to the component syndromes stored in the related component codeword index;
setting the modified bit in the related component codeword index to 1;
determining if the updated component syndromes are all zeros;
in the event it is determined the updated component syndromes are all zeros; setting the error free bit in the related component codeword index to 1; and
in the event it is determined the updated component syndromes are not all zeros, setting the error free bit in the related component codeword index to 0.

20. The method of claim 17, wherein updating, in the TPC buffer, the TPC codeword, includes:
generating one or more possible changes to a component codeword;
associating the possible changes with one or more write addresses in the TPC buffer;
determining whether to commit the possible changes;
in the event it is determined to commit the possible changes, applying the possible changes to the component codeword stored in the TPC buffer; and
in the event it is determined to not commit the possible changes, discarding the possible changes and associated write addresses.

* * * * *